US011289891B2

United States Patent
Spesser et al.

(10) Patent No.: US 11,289,891 B2
(45) Date of Patent: Mar. 29, 2022

(54) METHOD AND DEVICE FOR REDUCING LEAKAGE CURRENTS

(71) Applicant: Dr. Ing. h.c. F. Porsche Aktiengesellschaft, Stuttgart (DE)

(72) Inventors: Daniel Spesser, Illingen (DE); Tim Pfizenmaier, Leonberg (DE)

(73) Assignee: Dr. Ing. h.c. F. Porsche Aktiengesellschaft

(*) Notice: Subject to any disclaimer, the term of this patent is extended or adjusted under 35 U.S.C. 154(b) by 429 days.

(21) Appl. No.: 16/522,998

(22) Filed: Jul. 26, 2019

(65) Prior Publication Data

US 2020/0036180 A1  Jan. 30, 2020

(30) Foreign Application Priority Data

Jul. 27, 2018 (DE) .......................... 102018118259.7

(51) Int. Cl.
*H02H 1/04* (2006.01)
*B60L 53/30* (2019.01)
(Continued)

(52) U.S. Cl.
CPC .............. *H02H 1/04* (2013.01); *B60L 53/30* (2019.02); *G01R 31/52* (2020.01); *H02H 3/46* (2013.01); *H02J 7/02* (2013.01)

(58) Field of Classification Search
CPC .. H02H 1/04; H02H 3/46; H02H 3/17; H02H 9/08; H02H 3/33; H02H 9/02; H02H 3/16;
(Continued)

(56) References Cited

U.S. PATENT DOCUMENTS 6,388,451 B1   5/2002 Burba et al.
8,203,308 B1 * 6/2012 Guo .................... B60L 53/18
                                                            320/119
(Continued)

FOREIGN PATENT DOCUMENTS

DE         10139028 A1    5/2002
DE    102008024348 A1   12/2009
(Continued)

OTHER PUBLICATIONS

A. Albanna, M. N. Arafat, A. Gupta, M. Anwar and M. Teimor, "Analysis of ground fault currents in isolated and non-isolated charging modules in electric vehicles," 2015 IEEE Transportation Electrification Conference and Expo (ITEC), 2015, pp. 1-6 (Year: 2015).*

(Continued)

Primary Examiner — Daniel R Miller
(74) Attorney, Agent, or Firm — RatnerPrestia

(57) ABSTRACT

A method for reducing leakage currents in a protective conductor of an electricity network including a neutral conductor and a phase conductor in addition to the protective conductor. A differential current is determined depending on a phase conductor current in the phase conductor and a neutral conductor current in the neutral conductor. A compensation current is fed into the phase conductor and/or into the neutral conductor. The compensation current compensates for a leakage current caused by the differential current. Also described is a device for carrying out such a method.

12 Claims, 2 Drawing Sheets

(51) Int. Cl.
*H02J 7/02* (2016.01)
*G01R 31/52* (2020.01)
*H02H 3/46* (2006.01)

(58) Field of Classification Search
CPC ......... H02H 3/162; B60L 53/30; G01R 31/52; G01R 31/50; G01R 19/0092; G01R 19/10; H02J 7/02; H02J 7/0029; Y02T 10/70; Y02T 10/7072; Y02T 90/12; Y02T 90/14; Y02B 70/10; H02M 1/32; H02M 1/123; H02M 1/44; H02P 27/06
See application file for complete search history.

(56) References Cited

U.S. PATENT DOCUMENTS

| | | | | |
|---|---|---|---|---|
| 9,099,945 | B2 * | 8/2015 | Sakai | H02M 1/12 |
| 9,350,162 | B2 | 5/2016 | Bettenwort et al. | |
| 9,696,743 | B1 * | 7/2017 | Treichler | B60L 53/20 |
| 2010/0295508 | A1 * | 11/2010 | Mueller | B60L 55/00 |
| | | | | 320/109 |
| 2012/0249067 | A1 | 10/2012 | Hein et al. | |
| 2014/0210411 | A1 | 7/2014 | Fluxa et al. | |
| 2016/0134102 | A1 * | 5/2016 | Bieniek | H02S 50/00 |
| | | | | 363/55 |
| 2016/0380546 | A1 * | 12/2016 | Wang | H02M 7/217 |
| | | | | 363/21.12 |
| 2017/0302217 | A1 * | 10/2017 | Shinomoto | H02P 29/50 |

FOREIGN PATENT DOCUMENTS

| | | |
|---|---|---|
| EP | 2372857 A1 | 10/2011 |
| FR | 3013848 A1 | 5/2015 |
| WO | 2017001950 A1 | 1/2017 |

OTHER PUBLICATIONS

Chinese Office Action for Chinese Application No. 201910655390.9, dated May 6, 2021, 9 pages.
European search report dated Oct. 18, 2019.

* cited by examiner

METHOD AND DEVICE FOR REDUCING LEAKAGE CURRENTS

CROSS-REFERENCE TO RELATED APPLICATION

This application claims priority to German Patent Application No. DE 10 2018 118 259.7, filed Jul. 27, 2018, which is incorporated by reference herein in its entirety.

FIELD OF THE INVENTION

The invention relates to a method for reducing leakage currents in a protective conductor of an electricity network comprising a neutral conductor and a phase conductor in addition to the protective conductor. Further subject matter of the invention is a device for carrying out such a method.

BACKGROUND OF THE INVENTION

Particularly in electricity networks to which power converters are connected without galvanic isolation, i.e. without an isolation transformer, leakage currents caused by the power converter can occur in the protective conductor of the electricity network. If the leakage current exceeds a predefined value, this generally has the effect that a residual current device (RCD) trips and interrupts the current flow. In this case, the residual current device cannot differentiate between such operation-dictated leakage currents, i.e. leakage currents caused for example by a power converter, and leakage currents caused by an isolation fault. Undesired shutdowns that restrict the availability of the electricity network or the power converter therefore occur.

US 2014 210 411 A1, which is incorporated by reference herein, discloses a method for reducing leakage currents in a protective conductor of an electricity network, wherein, by means of a passive compensation circuit, a compensation current is generated and is introduced into the protective conductor in order to compensate for leakage currents. The compensation circuit comprises a transformer, a diode rectifier and a voltage divider and is galvanically connected to the protective conductor. In the case of this method, it has proved to be disadvantageous that the corresponding compensation circuit occupies a relatively large structural space and has a high weight, with the result that it fails to be sufficiently suitable for application onboard a vehicle.

Against this background, the problem addressed is that of reducing undesired leakage currents in an electricity network having a neutral conductor with a compact compensation circuit having a lower weight.

SUMMARY OF THE INVENTION

What is proposed for solving the problem is a method for reducing leakage currents in a protective conductor of an electricity network comprising a neutral conductor and a phase conductor in addition to the protective conductor, wherein a differential current is determined depending on a phase conductor current in the phase conductor and a neutral conductor current in the neutral conductor and a compensation current is fed into the phase conductor and/or into the neutral conductor, said compensation current compensating for a leakage current caused by the differential current.

In the method according to aspects of the invention, the leakage current in the protective conductor is not measured directly, but rather ascertained indirectly by a differential current that corresponds to the leakage current being determined. Said differential current is determined as a difference between the currents in the phase conductor and the neutral conductor. Depending on the differential current determined, a compensation current is generated and fed into the phase conductor and/or into the neutral conductor.

The measurement and the compensation of the leakage current can thus be carried out without galvanic connection to the protective conductor, for which reason a galvanic isolation in the corresponding compensation circuit, for example by means of a transformer, is not required. As a result, the compensation circuit can be embodied compactly and with low weight.

In accordance with one advantageous configuration of the invention, the differential current is determined by means of a differential current converter. The differential current converter can comprise a measurement pick-up, in particular in the manner of a clip-on ammeter, which encloses the phase conductor and the neutral conductor. A galvanic connection is not necessary, and so the differential current can be determined in a non-contact manner. The differential current resulting from the vectorial sum of the currents flowing in the phase conductor and the neutral conductor and having different current directions is preferably determined by means of the differential current converter. In the case of such a measurement by means of a differential current converter, the protective conductor is not led through the differential current converter.

One advantageous configuration provides for the differential current determined to be converted into a digital differential current by means of an analog-to-digital converter. The provision of a digital differential current makes possible the digital processing of the differential current determined, for example in a microcontroller or a digital filter. In this way, the structural space required for the compensation circuit can be further reduced and the susceptibility of the compensation circuit to interference can be reduced.

In accordance with one advantageous configuration of the invention, the compensation current is generated depending on the differential current determined and a predefined phase shift. Particularly preferably, the magnitude of the compensation current is identical to the magnitude of the differential current. The predefined phase shift is preferably 180°.

It is preferred if a frequency spectrum of the differential current determined is determined. Determining the frequency spectrum makes it possible to identify dominant spectral components in the differential current and to generate the compensation current in accordance with said spectral components. It has proved to be particularly advantageous if the frequency spectrum of the differential current determined is determined in a frequency range of 20 Hz to 300 kHz. A Fourier transformation, in particular a fast Fourier transformation (FFT), can be used for determining the frequency spectrum. Alternatively, the frequency spectrum can be ascertained by means of a p-Burg algorithm or a trigonometrical algorithm.

In this context, it has proved to be advantageous if the compensation current is generated depending on the frequency spectrum determined and a predefined phase shift. The predefined phase shift is preferably 1800.

The compensation current can be output by means of a digital-to-analog converter or by means of an amplifier, in particular by means of a rail-to-rail (R2R) amplifier or a class D amplifier.

Preferably, the compensation current is fed into the phase conductor and/or the neutral conductor via a capacitive coupling, with the result that a galvanic coupling to the protective conductor is not required.

In accordance with an alternative, preferred configuration, the compensation current is fed into the phase conductor and/or the neutral conductor via an inductive coupling.

In accordance with a further, alternative preferred configuration, the compensation current is fed into the phase conductor and/or the neutral conductor via a galvanic coupling.

Furthermore, a contribution is made to solving the problem mentioned in the introduction by a device for reducing leakage currents in a protective conductor of an electricity network comprising a neutral conductor and a phase conductor in addition to the protective conductor, wherein the device comprises a determining unit for determining a differential current depending on a phase conductor current in the phase conductor and a neutral conductor current in the neutral conductor and comprises an infeed unit for feeding a compensation current into the phase conductor and/or into the neutral conductor, said compensation current compensating for a leakage current caused by the differential current.

Further subject matter of the invention is a charging device for charging an electrical energy storage element with an electricity network and a device described above.

The same advantageous effects as have already been described in association with the method according to aspects of the invention can be achieved in the case of the device for reducing leakage currents and the charging device.

In accordance with one advantageous configuration of the charging device, provision is made for the latter to be configured as a galvanically non-isolated charging device.

Alternatively or additionally, in the case of the device and/or the charging device, the advantageous configurations and features described in association with the method according to aspects of the invention can also find application alone or in combination.

BRIEF DESCRIPTION OF THE DRAWING

Further details and advantages of the invention will be explained below on the basis of the exemplary embodiments shown in the figures, in which.

DETAILED DESCRIPTION OF THE INVENTION

Figure 1:
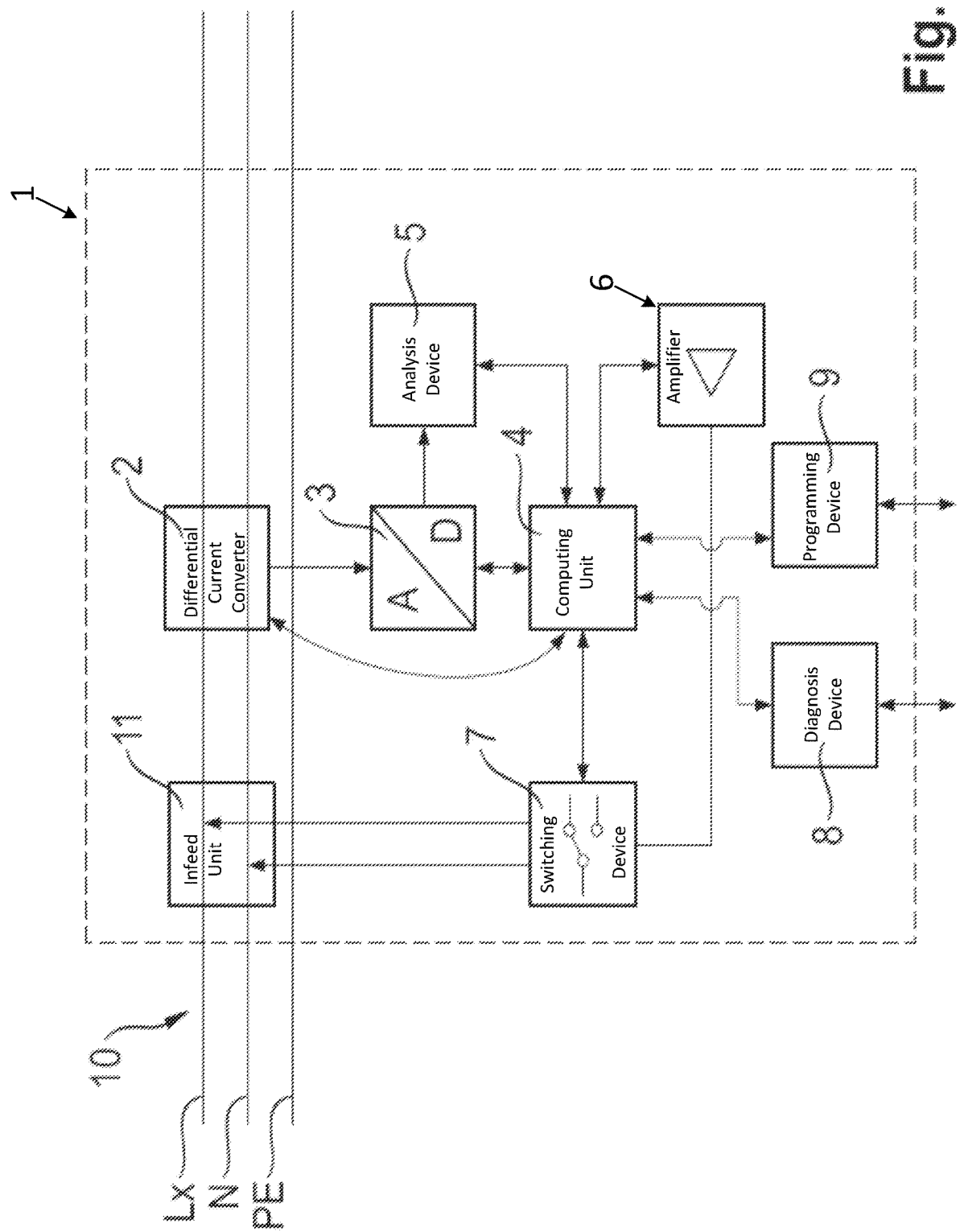
FIG. 1 shows a device for reducing leakage currents in a protective conductor of an electricity network in a schematic illustration.

The illustration in FIG. 1 shows an electricity network 10 having a phase conductor LX, a neutral conductor N and a protective conductor PE. Said electricity network 10 can be a supply network, for example, which is connected to a charging device for charging an electrical energy storage element of a vehicle, in particular of an electric or hybrid vehicle. The charging device is preferably a galvanically non-isolated charging device. The electricity network 10 is connected to a device 1 for reducing leakage currents in the protective conductor PE, which device will be explained in detail below:

The device 1 comprises a determining unit for determining a differential current, said determining unit being embodied as a differential current converter 2 and monitoring, in particular continuously, the phase conductor Lx and the neutral conductor N. In this respect, the phase conductor current in the phase conductor Lx and the neutral conductor current in the neutral conductor N are measured and the difference between these two currents is formed. The differential current determined in this way corresponds to the leakage current in the protective conductor PE. Therefore, it is not necessary to monitor the protective conductor PE directly with an ammeter.

A further component of the device 1 is an analog-to-digital converter 3, which is connected to the differential current converter 2. By means of the analog-to-digital converter 3, the analog differential current is converted into a digital differential current. The analog-to-digital converter 3 is connected to a computing unit 4, which can be embodied as a microcontroller, for example. A frequency spectrum of the differential current can be determined by means of the computing unit 4. By way of example, a fast Fourier transformation can be carried out for this purpose. Optionally, as an alternative or in addition, an analysis device 5 can be provided, which is connected to the analog-to-digital converter 3. The analysis device 5 can be configured to generate a frequency spectrum of the differential current. If such an analysis device 5 is provided, it is not necessary to carry out calculations for generating the frequency spectrum in the computing unit 4. It is thereby possible to relieve the burden on the computing unit 4.

Preferably, the frequency spectrum is determined in a range of 20 Hz to 300 kHz. The frequency spectrum contains amplitudes of the respective frequencies.

On the basis of the frequency spectrum and also a predefined phase shift, here 180°, the computing unit 4 generates an unamplified compensation current signal, which is fed to an amplifier 6 of the device 1. The amplifier 6 is preferably embodied as a rail-to-rail amplifier or as a class D amplifier. A digital-to-analog converter can alternatively be used instead of an amplifier 6. The amplifier 6 or the digital-to-analog converter generates a compensation current, which is fed to a switching device 7. By means of the switching device 7, the compensation current is selectively coupled to the phase conductor LX and/or the neutral conductor N.

The compensation current is fed into the phase conductor and/or the neutral conductor via a capacitive or an inductive infeed unit 11, such that a galvanic coupling to the protective conductor is not required. Alternatively, the infeed into the phase conductor and/or the neutral conductor can be carried out by means of a galvanically linked infeed unit.

Preferably, the computing unit 4 is configured to differentiate operation-dictated leakage currents, such as may be caused for example by a charging device that is not galvanically isolated from the electricity network 10, from undesired fault currents in the protective conductor PE. By way of example, provision can be made for the computing unit 4 to determine and store a characteristic frequency spectrum generated as a result of operation-dictated leakage currents. The computing unit is preferably configured to compare a frequency spectrum determined during the continuous monitoring of the differential current with the stored, characteristic frequency spectrum. If the deviation of the determined frequency spectrum from the stored, characteristic frequency spectrum exceeds a predefined threshold value, it is possible to generate a switching signal for driving the switching device 7. An exceedance of said threshold value indicates an undesired fault current. In such a case, the switching device 7 is driven by the switching signal in such a way that a compensation current is not fed into the phase conductor Lx and/or the neutral conductor N. This has the consequence that the leakage current in the protective conductor PE is not compensated for and a residual current device (not illustrated in the drawing) can be activated by the fault current in order to switch off the electricity network 10.

Further components of the device 1 are a diagnosis device 8 for acquiring statistical data, which can be read out via a diagnosis interface, and a programming device 9, via which the computing unit 4 can be programmed. By means of the programming device 9 it is possible, for example, to set operating parameters of the computing unit 4.

Furthermore, a self-calibration is implemented in the computing unit 4, and is carried out upon the computing unit 4 being started.

Figure 2:
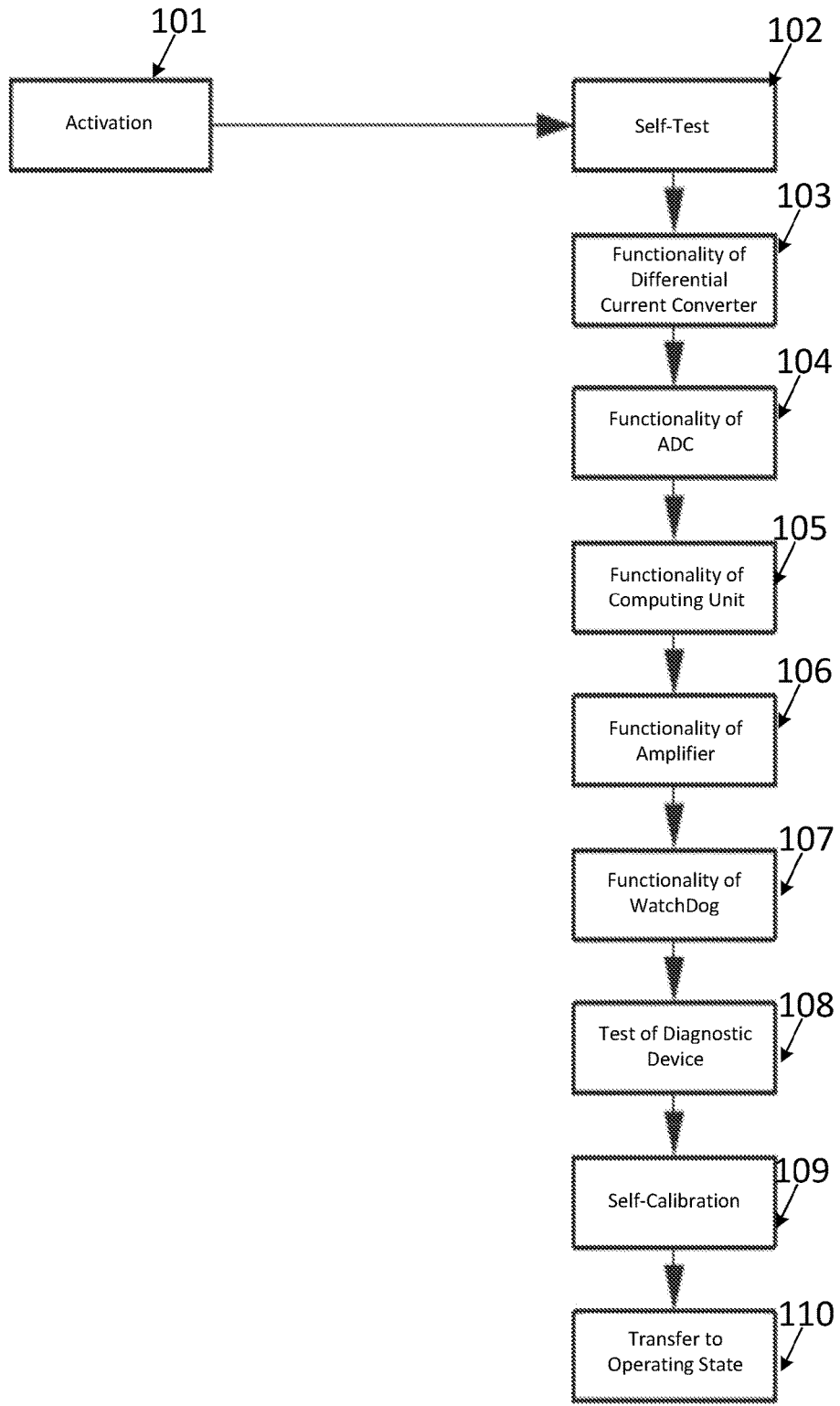
FIG. 2 shows a flow diagram of one exemplary embodiment of a method according to aspects of the invention for reducing leakage currents.

A method sequence 100 upon the computing unit 4 being started will be explained in greater detail below with reference to the flow diagram shown in FIG. 2. In an activation step 101, the device 1 is switched on. In a self-test step 102 succeeding activation step 101, a self-test of the device 1 is started. In a step 103, the functionality of the differential current converter 2 is checked. In a step 104, the functionality of the analog-to-digital converter 3 is checked. In step 105, the functionality of the computing unit 4 is checked and, in step 106, the functionality of the amplifier 6 is checked. In a step 107, the functionality of a watchdog of the computing unit 4 is tested. In step 108, a test of the diagnosis device 8 is carried out and, in step 109, a test of a self-calibration procedure is carried out.

If all of the checks are concluded positively, the device is transferred to an operating state in step 110. In the operating state 110, the differential current is determined depending on the phase conductor current in the phase conductor Lx and the neutral conductor current in the neutral conductor N and a compensation current is fed into the phase conductor Lx and/or into the neutral conductor N, said compensation current compensating for a leakage current caused by the differential current.

LIST OF REFERENCE SIGNS

1 Device for reducing leakage currents
2 Differential current converter
3 Analog-to-digital converter
4 Computing unit
5 Analysis unit
6 Amplifier
7 Switching device
8 Diagnosis device
9 Programming device
10 Electricity network
11 Infeed unit
100 Method sequence
102-109 Test steps
110 Operating state
Lx Phase conductor
N Neutral conductor
PE Protective conductor

What is claimed is:

1. A method for reducing leakage currents in a protective conductor (PE) of an electricity network comprising a neutral conductor (N) and a phase conductor (Lx) in addition to the protective conductor (PE), the method comprising:

determining a differential current depending on a phase conductor current in the phase conductor (Lx) and a neutral conductor current in the neutral conductor (N);

determining a frequency spectrum of the determined differential current;

generating the compensation current based on the determined frequency spectrum and a predefined phase shift; and feeding the compensation current into the phase conductor (Lx) and/or into the neutral conductor (N), said compensation current compensating for a leakage current caused by the differential current.

2. The method as claimed in claim 1, wherein the differential current is determined by a differential current converter.

3. The method as claimed in claim 1, further comprising converting the determined differential current into a digital differential current using an analog-to-digital converter.

4. The method as claimed in claim 1, further comprising generating the compensation current depending on the determined differential current and a predefined phase shift.

5. The method as claimed in claim 1, further comprising feeding in the compensation current via a capacitive coupling.

6. The method as claimed in claim 1, further comprising feeding in the compensation current via an inductive coupling.

7. The method as claimed in claim 1, further comprising feeding in the compensation current via a galvanic coupling.

8. The method as claimed in claim 1, wherein the compensation current is generated to have a frequency spectrum based on the determined a frequency spectrum of the determined differential current.

9. A device for reducing leakage currents in a protective conductor (PE) of an electricity network comprising a neutral conductor (N) and a phase conductor (Lx) in addition to the protective conductor (PE), the device comprising:

a determining unit for:
determining a differential current depending on a phase conductor current in the phase conductor (Lx) and a neutral conductor current in the neutral conductor (N),
determining a frequency spectrum of the determined differential current, and
generating the compensation current based on the determined frequency spectrum and a predefined phase shift; and an infeed unit for feeding a compensation current into the phase conductor (Lx) and/or into the neutral conductor (N), said compensation current compensating for a leakage current caused by the differential current.

10. A charging device for charging an electrical energy storage element with the electricity network and the device as claimed in claim 9.

11. The charging device as claimed in claim 10, wherein the charging device is a galvanically non-isolated charging device.

12. The device as claimed in claim 9, wherein the determining unit generates the compensation current to have a frequency spectrum based on the determined a frequency spectrum of the determined differential current.

* * * * *